United States Patent
Funsten

(10) Patent No.: US 6,274,396 B1
(45) Date of Patent: Aug. 14, 2001

(54) METHOD OF MANUFACTURING CALIBRATION WAFERS FOR DETERMINING IN-LINE DEFECT SCAN TOOL SENSITIVITY

(75) Inventor: William Pratt Funsten, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/771,747

(22) Filed: Jan. 29, 2001

(51) Int. Cl.$^7$ .................................................. H01L 21/66
(52) U.S. Cl. ........................ 438/14; 356/243.4; 356/243.6
(58) Field of Search .............................. 73/105; 436/172; 356/72, 243.4, 243.6; 438/486

(56) References Cited

U.S. PATENT DOCUMENTS

| | | | |
|---|---|---|---|
| 5,757,474 | * | 5/1998 | Sopori ................................. 356/72 |
| 5,767,967 | * | 6/1998 | Yufa .................................. 356/336 |
| 6,034,769 | * | 3/2000 | Yufa .................................. 356/335 |
| 6,173,604 | * | 1/2001 | Xiang ................................. 73/105 |
| 6,185,472 | * | 2/2001 | Onga ................................. 438/490 |
| 6,208,156 | * | 3/2001 | Hembree ............................ 324/755 |

\* cited by examiner

Primary Examiner—John F. Niebling
Assistant Examiner—Andre'n C. Stevenson
(74) Attorney, Agent, or Firm—H. Donald Nelson

(57) ABSTRACT

Methods of manufacturing calibration wafers by forming a first layer of a material on a layer of a substrate material. In a first embodiment, calibration spheres are deposited on the first layer of material followed by an etch process that removes exposed portions of the first layer of a material. The calibration spheres are removed leaving pillars of the first layer of a material formed on the layer of a substrate material. The calibration spheres can be of various sizes forming pillars of various sizes. The calibration wafer with the various size pillars is scanned in a scan tool to determine the scan tool sensitivity. In a second embodiment, a layer of a second material is deposited on and around the various size pillars forming bumps over the various size pillars. In a third embodiment, a layer of a material is formed on a layer of a substrate, a layer of photoresist is formed on the layer of material, the layer of photoresist is patterned and developed, calibration spheres are deposited on the layer of material, the exposed portions of the layer of material is etched leaving structures having the shape of the developed layer of photoresist and pillars under the calibration spheres. The calibration spheres are then removed.

4 Claims, 5 Drawing Sheets

METHOD OF MANUFACTURING CALIBRATION WAFERS FOR DETERMINING IN-LINE DEFECT SCAN TOOL SENSITIVITY

BACKGROUND OF THE INVENTION

1. Field of the Invention

This invention relates generally to analysis tools used in the processes for the manufacture of semiconductor devices. More specifically, this invention relates to determining the sensitivity of the scan tools used in the manufacture of semiconductor devices. Even more specifically, this invention relates to a method of manufacturing calibration wafers to determine the sensitivity of scan tools used in the manufacture of semiconductor devices.

2. Discussion of the Related Art

In order to remain competitive, a semiconductor manufacturer must continuously increase the performance of the semiconductor integrated circuits being manufactured and at the same time, reduce the cost of the semiconductor integrated circuits. Part of the increase in performance and the reduction in cost of the semiconductor integrated circuits is accomplished by shrinking the device dimensions and by increasing the number of circuits per unit area on an integrated circuit chip. Another part of reducing the cost of a semiconductor chip is to increase the yield. As is known in the semiconductor manufacturing art, the yield of chips (also known as die) from each wafer is not 100% because of defects during the manufacturing process. The number of good chips obtained from a wafer determines the yield. As can be appreciated, chips that must be discarded because of a defect or defects increases the cost of the remaining usable chips because the cost of manufacturing the wafer must be apportioned to the number of good chips that can be sold to consumers.

A single semiconductor chip can require numerous process steps such as oxidation, etching, metallization and wet chemical cleaning. Some of these process steps involve placing the wafer on which the semiconductor chips are being manufactured into different tools during the manufacturing process. The optimization of each of these process steps requires an understanding of a variety of chemical reactions and physical processes in order to produce high performance, high yield circuits. The ability to view and characterize the surface and interface layers of a semiconductor chip in terms of their morphology, chemical composition and distribution is an invaluable aid to those involved in research and development, process, problem solving, and failure analysis of integrated circuits.

After many of these process steps, the wafer is placed in a scan tool that detects defects. As the semiconductor devices have become smaller, the size of defects that are or can be "killer" defects has also become smaller. Because of this, it has become increasingly important and critical that the smaller size defects can be accurately detected. However, it has been found that each scan tool has a different sensitivity (calibration) at the lower end, that is, each scan tool can "just" detect different size defects.

Therefore, what is needed is an accurate method of determining the sensitivity of each scan tool in order to determine the smallest size of defects that the scan tool can accurately detect.

SUMMARY OF THE INVENTION

According to the present invention, the foregoing and other objects and advantages are obtained by a method of manufacturing calibration wafers that allow an accurate determination of the sensitivity of in-line scan tools.

In accordance with a first aspect of the invention, a first layer of a material is formed on a layer of a substrate material. Calibration spheres are deposited on the first layer of material followed by an etch process that removes exposed portions of the first layer of material. The calibration spheres are removed leaving pillars of the first layer of material formed on the layer of substrate material. The calibration spheres can be of various sizes forming pillars of various sizes. The calibration wafer is run through a scan tool to determine the sensitivity of the scan tool.

In accordance with another aspect of the invention, a layer of a second material is deposited on and around the various size pillars forming bumps over the various size pillars. The calibration wafer is then run through a scan tool to determine the sensitivity of the scan tool.

In accordance with another aspect of the invention, a layer of material is formed on a layer of a substrate, a layer of photoresist is formed on the layer of material, the layer of photoresist is patterned and developed, calibration spheres are deposited on the layer of material, the exposed portions of the layer of material is etched leaving structures having the shape of the developed layer of photoresist and pillars under the calibration spheres. The calibration spheres are then removed and the wafer is run through a scan tool to determine the sensitivity of the scan tool.

The described invention thus provides a method of manufacturing calibration wafers that allow an accurate determination of the sensitivity of scan tools.

The present invention is better understood upon consideration of the detailed description below, in conjunction with the accompanying drawings. As will become readily apparent to those skilled in the art from the following description, there is shown and described embodiments of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DETAILED DESCRIPTION

Reference is now made in detail to a specific embodiment or specific embodiments of the present invention that illustrate the best mode or best modes presently contemplated by the inventors for practicing the invention.

Figure 1A:
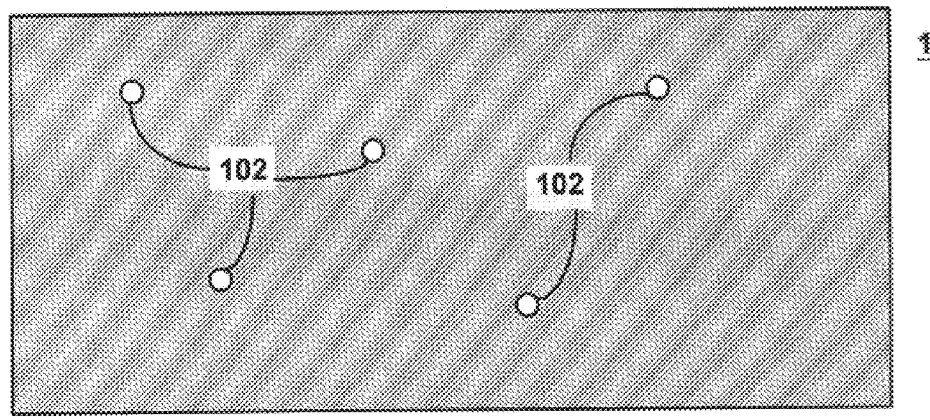
FIG. 1A is a top view of a portion of a first semiconductor calibration wafer with calibration spheres placed on the surface of the wafer that can be used to determine the sensitivity of an in-line scan tool.

FIG. 1A is a top view of a portion 100 of a first semiconductor calibration wafer with calibration spheres 102 placed on the surface of the wafer. The calibration spheres can be polystyrene latex (PSL) spheres or other commercially available calibrated particles such as glass or alumina spheres. The calibration spheres 102 are shown placed at random on the surface of the wafer. The sensitivity of in-line defect detection tools can be determined by the smallest size sphere that can be counted with a high percentage of certainty, for example a certainty of 95% or above when the wafer that includes the portion 100 is placed in a scan tool and scanned. This is accomplished by placing different size calibration spheres on different wafers or on different portions of the same wafer and determining which size calibrations spheres provide the required sensitivity when placed in a scan tool and scanned.

Figure 1B:
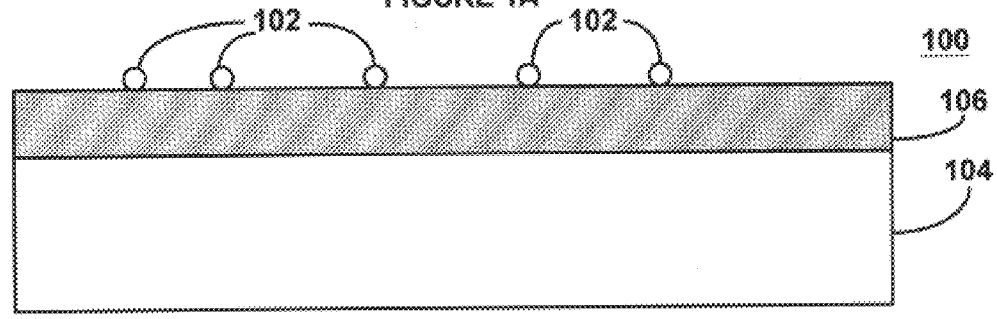
FIG. 1B is a side view of the portion of the first semiconductor calibration wafer shown in FIG. 1A showing the calibration spheres on the surface of the wafer.

FIG. 1B is a side view of the portion 100 of the first semiconductor calibration wafer as shown in FIG. 1A. The portion 100 of the first semiconductor calibration wafer includes a first layer 104 of a material that could be a semiconductor substrate material. A second layer 106 of a material is formed on the first layer 104. The second layer 106 is formed from a material that may be affected by defects in an actual manufacturing process. For example, the second layer 106 could be formed from a typical metal that is used in an actual manufacturing process, such as aluminum, tungsten or other types of materials such as polysilicon or silicon oxide.

Figure 2A:
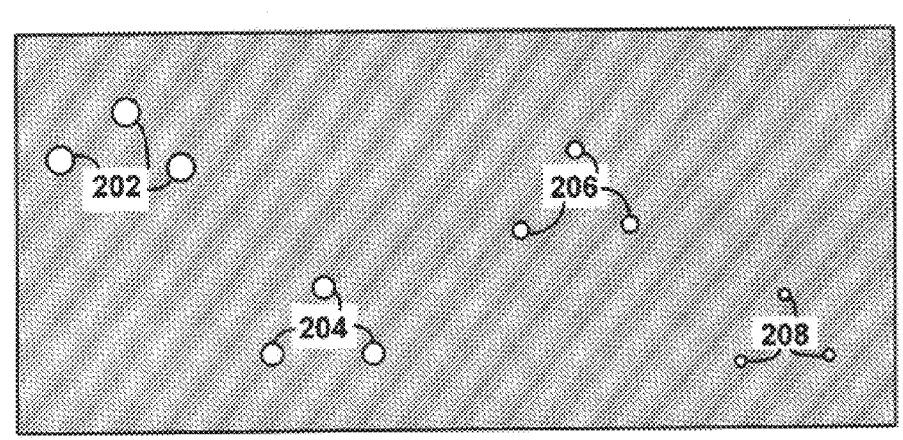
FIG. 2A is a top view of a portion of a second semiconductor calibration wafer with various sizes of calibration spheres placed on the surface of the wafer that can be used to form structures to determine the sensitivity of an in-line scan tool.

FIG. 2A is a top view of a portion 200 of a second semiconductor calibration wafer with various sizes of calibration spheres placed on the surface of the wafer. The spheres 202, 204, 206 and 208 are just four of the various sizes that can be used for calibration. The spheres are of known size and can be deposited on the wafers with conventional methods and equipment such as the PDS-100™ (VLSI Standard Inc.) or the Model 2300 PSL/Process Particle Deposition System (MSP Corporation) to control the number and location of the spheres deposited on the wafer.

Figure 2B:
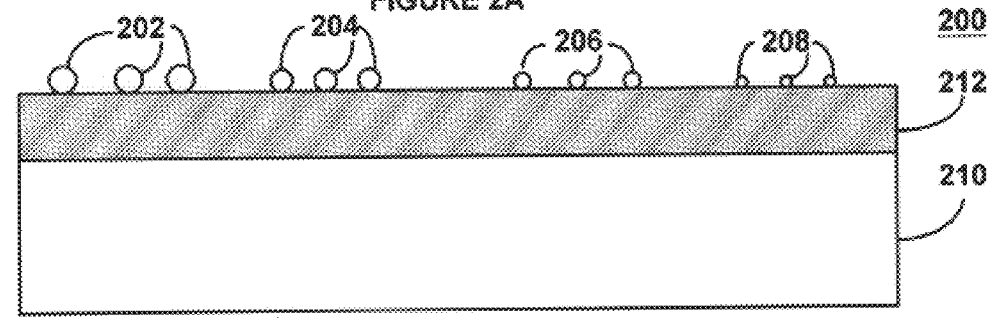
FIG. 2B is a side view of the portion of the second semiconductor calibration wafer shown in FIG. 2A.

FIG. 2B is a side view of the portion 200 of the second calibration wafer as shown in FIG. 2A. FIG. 2B is similar to FIG. 1B and includes a first layer 210 of a material that could be a substrate and a second layer 212 that could be formed from a typical material as described above in the discussion in conjunction with FIG. 1B.

Figure 2C:
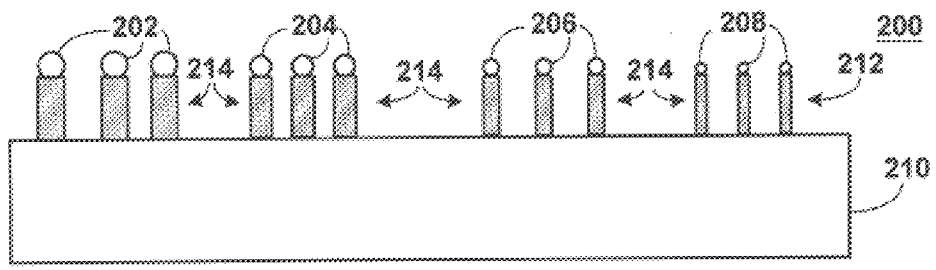
FIG. 2C shows the portion of the second semiconductor calibration wafer as shown in FIG. 2A after an etch process that forms pillars under the calibration spheres.

FIG. 2C shows the portion 200 of the second semiconductor calibration wafer as shown in FIG. 2B after an appropriate anisotropic etch process etches the second layer 212 of material down to the surface of the first layer 210 leaving pillars 214 of the second layer 212 of material. The calibration spheres protect the underlying second layer 214 of material from the etch process whereby pillars are formed. The pillars have the same nominal size as the calibration spheres that serve to protect the underlying material from the etch process. The actual size depends upon the amount of undercut that may occur during the etch process.

Figure 2D:
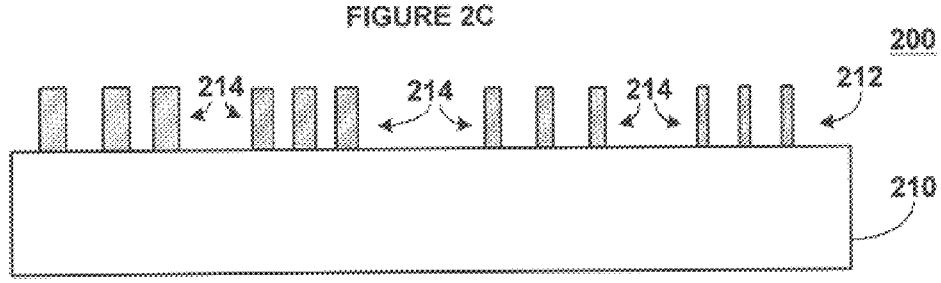
FIG. 2D shoes the portion of the second semiconductor calibration wafer as shown in FIG. 2C with the calibration spheres removed.

FIG. 2D shows the portion 200 of the second semiconductor calibration wafer as shown in FIG. 2C after the calibration spheres have been removed from the pillars that have been formed. The calibration wafer that includes the portion 200 is placed in a scan tool to determine the sensitivity.

Figure 3A:
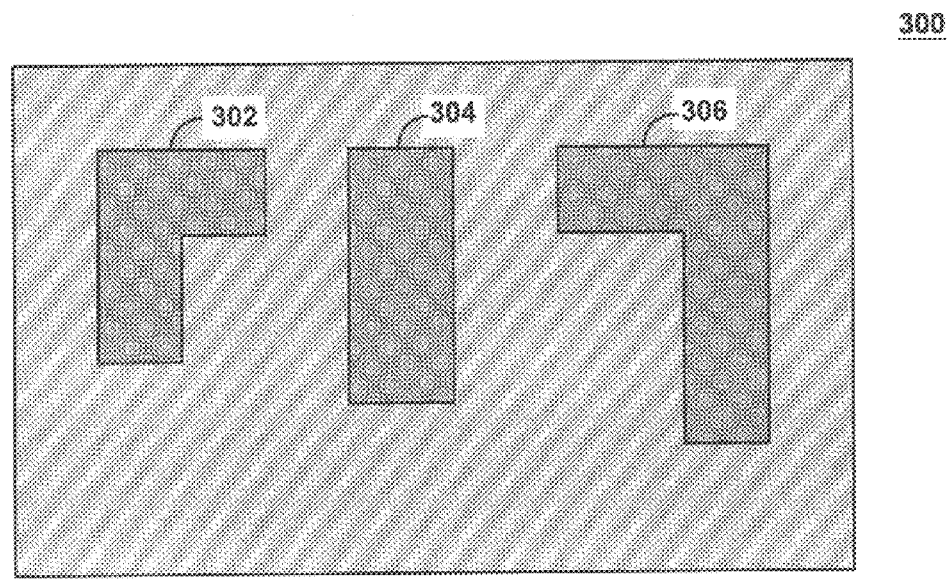
FIG. 3A is a top view of a portion of a third semiconductor calibration wafer with structures formed from photoresist that are similar to structures that are formed on an actual product wafer.

FIG. 3A is a top view of a portion 300 of a third semiconductor calibration wafer with structures 302, 304 & 306 formed. The structures 302, 304 & 306 have shapes that could be found in an actual semiconductor manufacturing process.

Figure 3B:
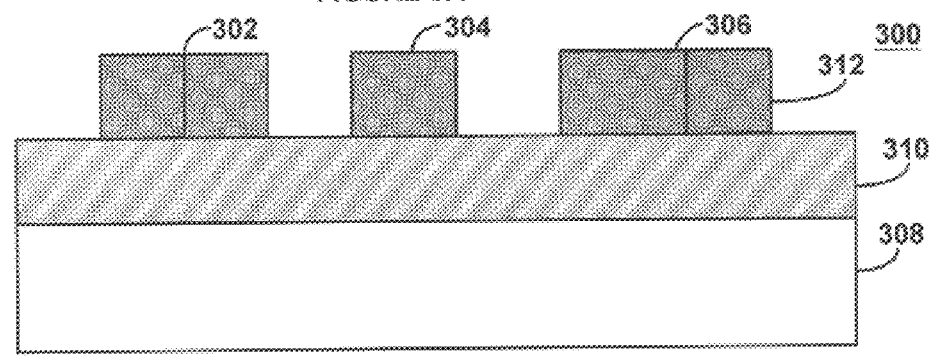
FIG. 3B is a side view of the portion of the third semiconductor calibration device shown in FIG. 3A.

FIG. 3B is a side view of the portion 300 of the third semiconductor calibration wafer showing side views of the structures 302,304 & 306. The third semiconductor calibration wafer includes a first layer 308 of material that could be a semiconductor substrate material. A second layer 310 of material is formed on the first layer 308. The second layer 310 is formed from a material that may be affected by defects in an actual manufacturing process. For example, the second layer 310 could be formed from a typical metal that is used in an actual manufacturing process, such as aluminum, tungsten or other types of materials such as polysilicon or silicon oxide. The structures 302,304 & 306 are formed from a layer of photoresist 312 that has been patterned and developed to form the shapes of the structures 302,304 & 306.

Figure 3C:
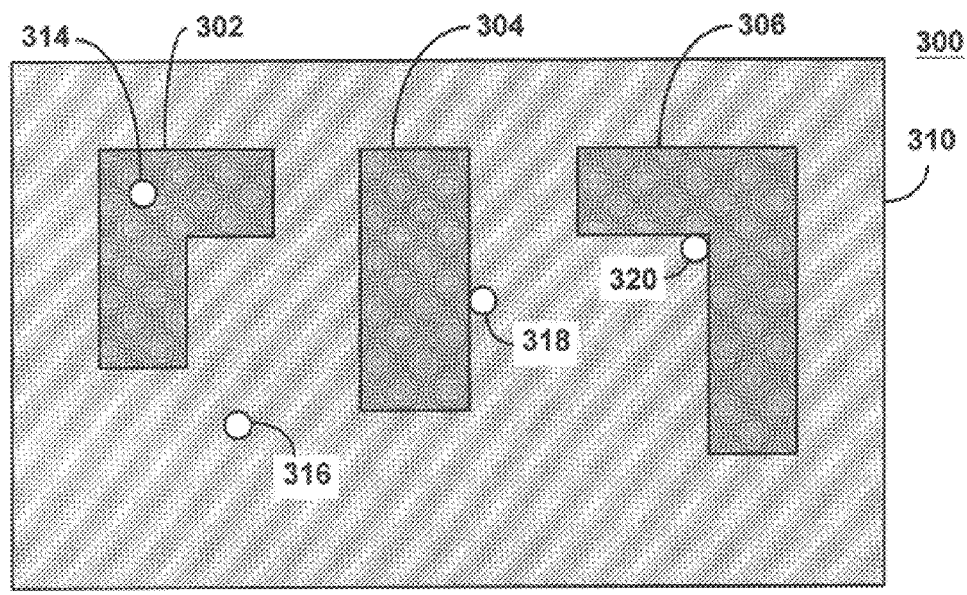
FIG. 3C is a top view of the portion of the third semiconductor calibration wafer as shown in FIG. 3A with calibration spheres placed on the surface of the third semiconductor device.

FIG. 3C is a top view of the portion 300 of the third semiconductor calibration wafer as shown in FIG. 3A with calibration spheres 314, 316, 318 & 320 placed on selected portions of the wafer. Calibration sphere 314 is on the surface of structure 302, calibration sphere 316 is on the surface of the second layer 310, calibration sphere 318 is on the surface of the second layer 310 immediately adjacent to the structure 304, and calibration sphere 320 is on the surface of the second layer 310 immediately adjacent to a corner of the structure 306.

Figure 3D:
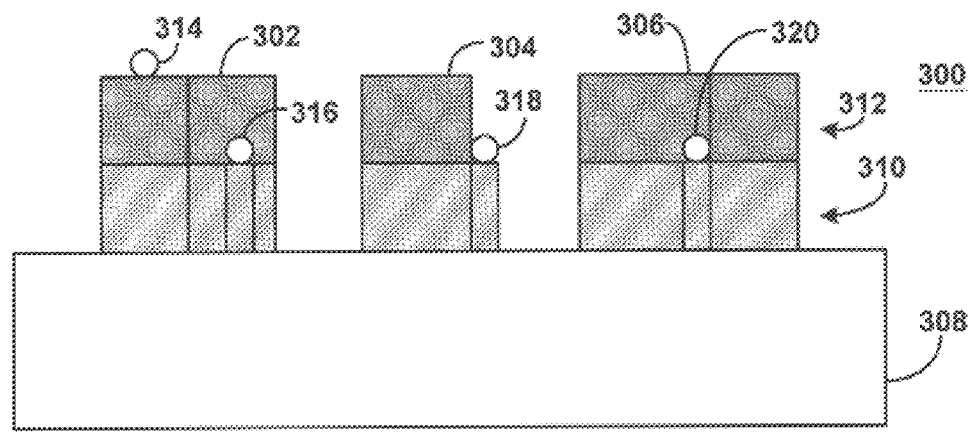
FIG. 3D is a side view of the portion of the third semiconductor calibration wafer as shown in FIG. 3C after an etch process to remove unprotected portions of a layer of film.

FIG. 3D is a side view of the portion 300 of the third semiconductor calibration wafer as shown in FIG. 3C after an anisotropic etch process that removes portions of the second layer 310 not protected by the photoresist structures 302, 304 & 306 or protected by the calibration sphere s that are on the surface of the second layer 310.

Figure 3E:
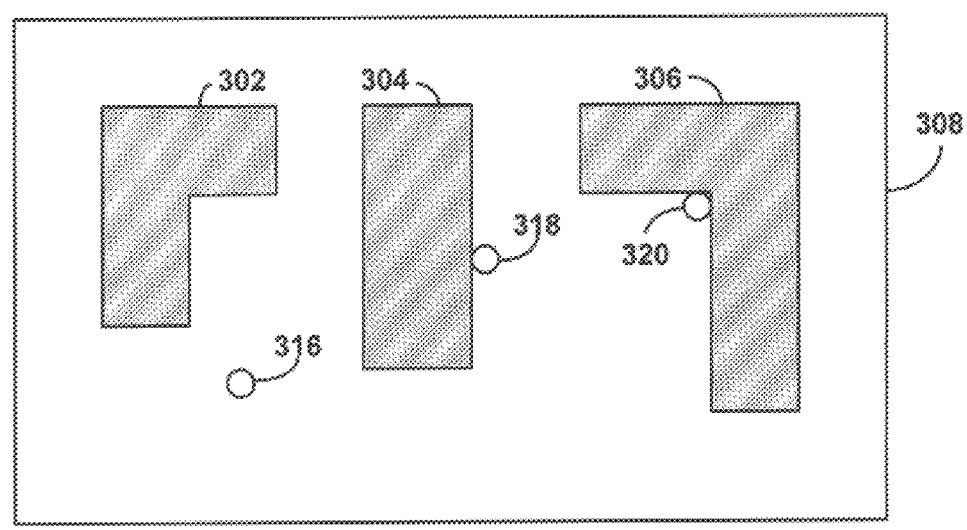
FIG. 3E shows the portion of the third semiconductor calibration wafer as shown in FIG. 3D with the remaining portions of the photoresist removed.

FIG. 3E is a top view of the portion 300 of the third semiconductor calibration wafer as shown in FIG. 3D after the remaining portions of the layer 312 of photoresist have been removed and showing the positional relationships between the structures 302, 304 & 306 and the calibration spheres 316, 318 & 320 that remain after the etch process.

Figure 3F:
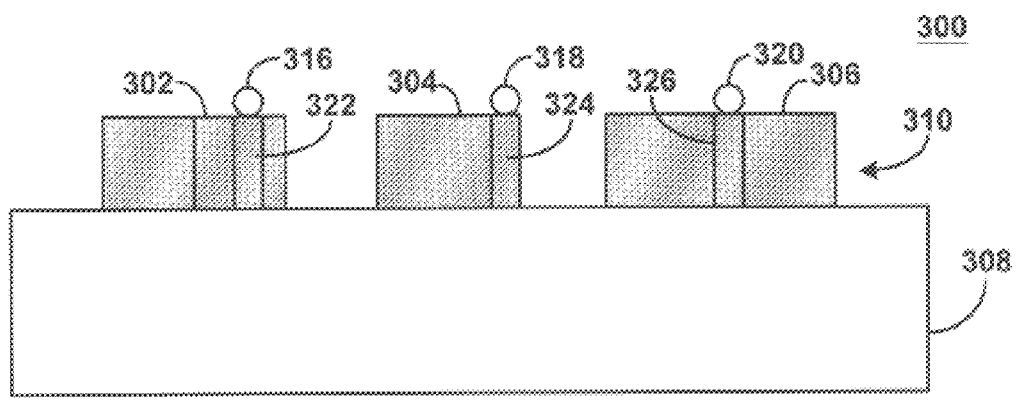
FIG. 3F is a side view of the portion of the third semiconductor calibration wafer as shown in FIG. 3E.

FIG. 3F is a side view of the portion 300 of the third semiconductor calibration wafer as shown in FIG. 3E showing the structures 302, 304 & 306, the calibration spheres 316, 318 & 320 and pillars 322, 324 & 326 formed under the calibrations spheres 316, 318 & 320, respectively.

Figure 3G:
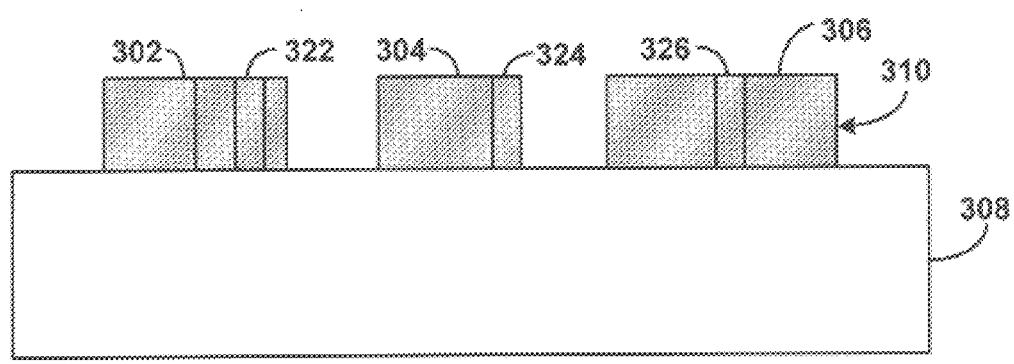
FIG. 3G shows the portion of the third semiconductor calibration wafer as shown in FIG. 3F with the calibration spheres removed from the surface of the device.

FIG. 3G shows the portion 300 of the third semiconductor calibration wafer as shown in FIG. 3F with the calibration spheres removed. The third semiconductor calibration wafer is then run through a scan tool to determine which pillars can be detected with the required sensitivity. It is noted that other size pillars can be formed in order to determine the sensitivity.

Figure 4A:
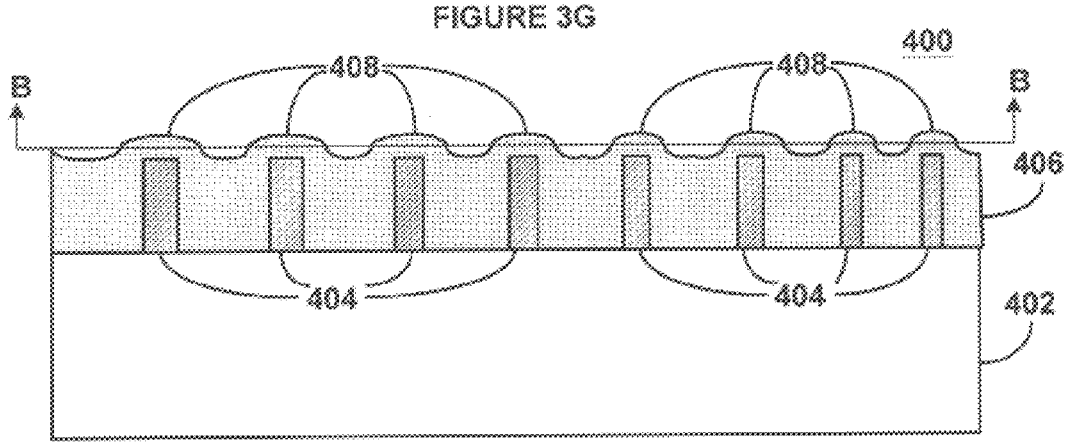
FIG. 4A is a side view of a portion of a semiconductor calibration wafer with a layer of semiconductor material formed on and around calibration structures.

FIG. 4A shows a portion 400 of a semiconductor calibration wafer that includes a first layer 402 of material that could be a semiconductor substrate. A series of various size pillars 404 are shown formed on the first layer 402. A layer 406 of a material is deposited on and over the pillars 404 forming various size bumps 408 over the pillars 404.

Figure 4B:
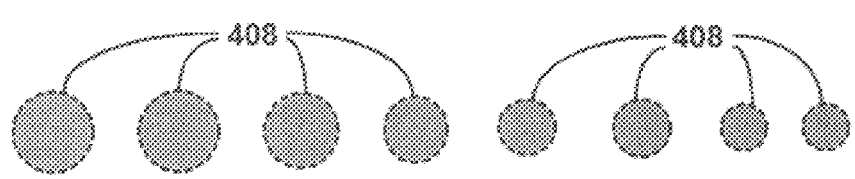
FIG. 4B is a top view along BB of the portion of the semiconductor calibration wafer as shown in FIG. 4A.

FIG. 4B is a top view along line BB in FIG. 4A showing the nominal dimensions of the various size bumps 408. The semiconductor calibration wafer with the various sized bumps 408 can be placed in a scan tool to determine which size bumps the scan tool can detect to determine the sensitivity of the scan tool.

Figure 5A:
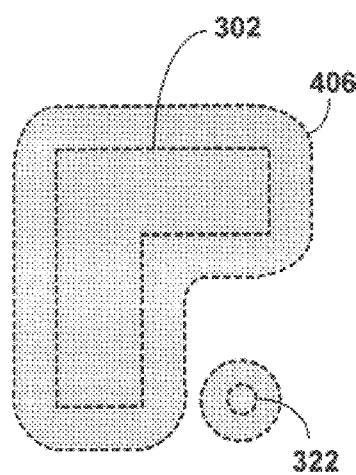
FIGS. 5A–5C are cross sectional views of structures with a layer of semiconductor material formed on the calibration structures as shown in FIG. 3A.
Figure 5B:
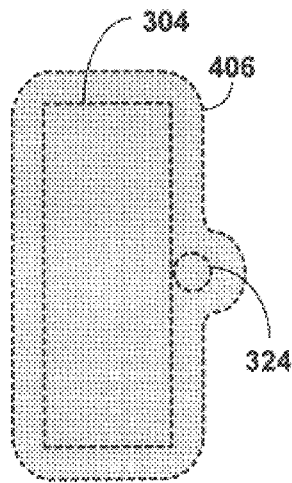
Figure 5C:
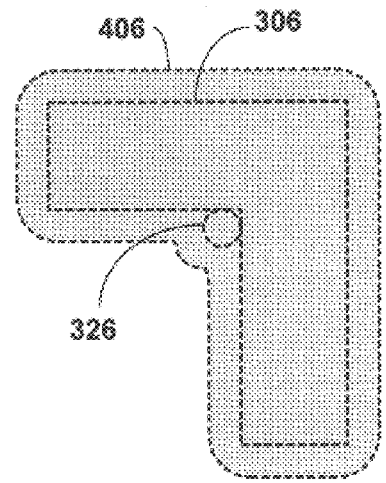

FIGS. 5A–5C show the structures 302, 304 & 306 as shown in FIG. 3E covered with the layer 406 as shown in FIG. 4A and along a line BB as shown in FIG. 4B. The calibration wafer that includes the material covered structures as shown in FIGS. 5A–5C is run through a scan tool to determine the sensitivity of the scan tool. It is noted that the similar structures with different size pillars can be formed so that an accurate sensitivity of the scan tool can be determined.

In summary, the described invention thus provides a method of manufacturing calibration wafers that allow an accurate determination of the sensitivity of scan tools.

The foregoing description of the embodiments of the invention has been presented for purposes of illustration and description. It is not intended to be exhaustive or to limit the invention to the precise form disclosed. Obvious modifications or variations are possible in light of the above teachings. The embodiments were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of manufacturing calibration wafers for determining in-line defect scan tool sensitivity, the method comprising:

(a) forming a layer of a first material on a layer of a substrate;

(b) depositing calibration spheres on the layer of a first material;

(c) etching portions of the layer of a first material not covered by the calibration spheres forming pillars of the first material under the calibration spheres; and (d) removing the calibration spheres from the pillars.

2. The method of claim 2 wherein step (b) is accomplished by depositing various size calibration spheres on the layer of a first material whereby various size pillars are formed under the various size calibration spheres.

3. The method of claim 2 further comprising (d) depositing a layer of a second material on and around the various size pillars forming various size bumps over the various size pillars.

4. A method of manufacturing calibration wafers for determining in-line defect scan tool sensitivity, the method comprising:

(a) forming a layer of a material on a layer of a substrate;

(b) depositing a layer of photoresist on the layer of a material;

(c) patterning and developing the layer of photoresist exposing portions of the layer of a material;

(d) depositing calibration spheres on the layer of a material;

(e) etching exposed portions of the layer of a material down to the layer of a substrate forming structures in the layer of a material having the shape of the developed layer of photoresist and forming pillars in layer of material under the calibration spheres;

(f) removing remaining portions of the layer of photoresist; and (g) removing the calibration spheres.

* * * * *